(12) United States Patent
Mithal et al.

(10) Patent No.: US 6,977,907 B2
(45) Date of Patent: Dec. 20, 2005

(54) DIGITAL CIRCUIT SYNTHESIS SYSTEM

(75) Inventors: Arvind Mithal, Arlington, MA (US); James C. Hoe, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 236 days.

(21) Appl. No.: 10/624,962

(22) Filed: Jul. 22, 2003

(65) Prior Publication Data

US 2004/0052215 A1 Mar. 18, 2004

Related U.S. Application Data

(63) Continuation of application No. 09/377,372, filed on Aug. 19, 1999, now Pat. No. 6,597,664.

(51) Int. Cl.[7] .............................................. G06F 17/50
(52) U.S. Cl. ........................ 370/252; 370/463; 716/18
(58) Field of Search ................................ 370/252, 463, 370/503, 229, 419, 412, 428, 395.21, 395.1, 395.42, 395.62, 301; 716/18, 1; 703/14

(56) References Cited

U.S. PATENT DOCUMENTS

| 4,114,189 | A | * | 9/1978 | Davis ......................... 708/270 |
| 5,541,850 | A | * | 7/1996 | Vander Zanden et al. ..... 716/18 |
| 5,905,664 | A | * | 5/1999 | Ko et al. ..................... 708/491 |
| 5,912,678 | A | * | 6/1999 | Saxena et al. ............... 700/103 |
| 6,099,577 | A | * | 8/2000 | Isobe .......................... 703/14 |
| 6,216,260 | B1 | * | 4/2001 | Neyfakh ...................... 716/18 |
| 6,275,973 | B1 | * | 8/2001 | Wein ........................... 716/10 |
| 6,578,187 | B2 | * | 6/2003 | Yasuda ........................ 716/18 |

FOREIGN PATENT DOCUMENTS

| EP | 0329233 | 10/1989 |
| EP | 082902120 A2 | 9/1997 |

OTHER PUBLICATIONS

Arvind et al., "Using Term Rewriting Systems to Design and Verify Processors", IEEE Micro Special Issue, May/Jun. 1999.

Babb et al., "Parallelizing Applications into Silicon", MIT Laboratory of Computer Science, Apr. 1999.

Cook et al., "Formal verification of explicitly parallel microprocessors", Mar. 5, 1999.

Gupta et al., "Hardware–software Co–synthesis for Digital Systems", Computer Science Laboratory, Stanford University, 1993.

(Continued)

*Primary Examiner*—Brian Nguyen
(74) *Attorney, Agent, or Firm*—Fish & Richardson P.C.

(57) ABSTRACT

A method for specifying and synthesizing a synchronous digital circuit by first accepting a specification of an asynchronous system in which stored values are updated according to a set of state transition rules. For instance, the state transition rules are specified as a Term Rewriting System (TRS) in which each rule specifies a number of allowable state transitions, and includes a logical precondition on the stored values and a functional specification of the stored values after a state transition in terms of the stored values prior to the state transition. The specification of the asynchronous circuit is converted into a specification of an synchronous circuit in which a number of state transitions can occur during each clock period. The method includes identifying sets of state transitions, for example by identifying sets of TRS rules, that can occur during a single clocking period and forming the specification of the synchronous circuit to allow any of the state transitions in a single set to occur during any particular clocking period.

7 Claims, 10 Drawing Sheets

OTHER PUBLICATIONS

Liao et al., "An Efficient Implementation of Reactivity for Modeling Hardware int ehScenic Design Environment", University of California at Irvine, 1997.

Matthews et al., "Microprocessor Specification in Hawk", 1998.

Polyneer et al., "A TRS Model for a Modern Microprocessor", MIT Computation Structures Group Memo 408, Jun. 25, 1998.

Shen et al., "Design and Verification of Speculative Processors", MIT Computations Structures Group Memo 400 (B), 1998.

Shen et al., "Modeling and Verification of ISA Implementations", MIT Computations Structures Group Memo 400 (A), 1998.

Shen et al., "Using Term Rewriting Systems to Design and Verify Processors" Massachusetts Institute of Technology (Jun. 1999).

Subrahmanyam et al., Ayutomated Synthesis of Mixed-–Mode (Asynchronous and Synchronous) Systems AT&T Technical Journal (Jan. 1991).

Windley, P., "Verifying Pipelined Microprocessors", Brigham Young University, 1995.

Windley, P., "Specifying Instruction–Set Architecture in HOL: A Primer", Brigham Young University, 1994.

* cited by examiner

| 701 | *Type* | PROC  | = Proc(PC,RF,IMEM,DMEM) |
| --- | --- | --- | --- |
| 702 | *Type* | PC    | = Bit[n] |
| 703 | *Type* | ADDR  | = Bit[n] |
| 704 | *Type* | VALUE | = Bit[n] |
| 705 | *Type* | RF    | = *Array* VALUE[RNAME] |
| 706 | *Type* | RNAME | = Reg0 \|\| Reg1 \|\| Reg2 \|\| Reg3 \|\| . . . . Regm |
| 707 | *Type* | IMEM  | = *Array* INST[PC] |
| 708 | *Type* | DMEM  | = *Array* VALUE[ADDR] |
| 709 | *Type* | INST  | = Loadc(RNAME,VALUE) |
| 710 |   |   | \|\| Loadpc(RNAME) |
| 711 |   |   | \|\| Op(MINOR,RNAME,RNAME,RNAME) |
| 712 |   |   | \|\| Bz(RNAME,RNAME) |
| 713 |   |   | \|\| Load(RNAME,RNAME) |
| 714 |   |   | \|\| Store(RNAME,RNAME) |
| 715 | *Type* | MINOR | = Add \|\| Sub \|\| . . . . |

FIG. 7

801 Proc(*pc,rf,im,dm*)
802 *if* im[pc]≡Loadc(*rd,const*) → Proc(*pc*+1,*rf*[*rd*:=*const*],*im,dm*)
803 *if* im[pc]≡Loadpc(*rd*) → Proc(*pc*+1,*rf*[*rd*:=*pc*],*im,dm*)
804 *if* im[pc]≡Op(*op,rd,r1,r2*) → Proc(*pc*+1,*rf*[*rd*:=$\underline{op}$(*rf*[*r1*],*rf*[*r2*])],*im,dm*)
805 *if* im[pc]≡Bz(*rc,rt*) & *rf*[*rc*]≡0 → Proc(*rf*[*rt*],*rf,im,dm*)
806 *if* im[pc]≡Bz(*rc,rt*) & *rf*[*rc*]≠0 → Proc(*pc*+1,*rf,im,dm*)
807 *if* im[pc]≡Load(*rd,ra*) → Proc(*pc*+1,*rf*[*rd*:=*dm*[*rf*[*ra*]]],*im,dm*)
808 *if* im[pc]≡Store(*ra,r*) → Proc(*pc*+1,*rf,im,dm*[*rf*[*ra*]:=*rf*[*r*]])

FIG. 8

1101 *Type*     $PROC_p$ = $Proc_p$(PC,RF,BS,IMEM,DMEM)
1102 *Type*          BS = *FIFO* ITEMP
1103 *Type*     ITEMP = Op(MINOR,RNAME,VALUE,VALUE)
1104                  || Bz(VALUE,VALUE)
1105                  || Load(RNAME,ADDR)
1106                  || Store(ADDR,VALUE)

FIG. 11

1201     $Proc_p$(*pc,rf,bs,im,dm*)
1202         *if*   *im[pc]*≡*inst and* (*Source*(*inst*) ∩ *Target*(*bs*) ≡ ∅)
1203 →   $Proc_p$(*pc*+1,*rf*,enq(*bs*,*Decode*(*inst*)),*im*,*dm*)

FIG. 12A

1211   $Proc_p$(*pc,rf,bs,im,dm*) where *itemp*:=first(*bs*)
1212   *if itemp*≡Op(*op,rd,v1,v2*)    →   $Proc_p$(*pc,rf*[*rd*:=*op*(*v1,v2*)],deq(*bs*),*im,dm*)
1213   *if itemp*≡Bz(*vc,vt*) & *vc*≡0   →   $Proc_p$(*vt,rf*,clear($\overline{bs}$),*im,dm*)
1214   *if itemp*≡Bz(*vc,vt*) & *vc*≠0   →   $Proc_p$(*pc,rf*,deq(*bs*),*im,dm*)
1215   *if itemp*≡Load(*rd,va*)       →   $Proc_p$(*pc,rf*[*rd*:=*dm*[*va*]],deq(*bs*),*im,dm*)
1216   *if itemp*≡Store(*va,v*)        →   $Proc_p$(*pc,rf*,deq(*bs*),*im,dm*[*va*:=*v*])

FIG. 12B

1301   $Proc_p(pc, rf, bs, im, dm)$
1302   $\quad if \quad im[pc] \equiv inst \quad and \quad im[pc+1] \equiv inst'$
1303   $\quad and \quad Source(inst) \cap Target(bs) \equiv \emptyset$
1304   $\quad and \quad Source(inst') \cap (Target(bs) \cup Target(inst)) \equiv \emptyset$
1305 $\rightarrow Proc_m((pc+1)+1, rf, enq(enq(bs, Decode(inst)), Decode(inst')), im, dm)$

FIG. 13A

1311   $Proc_p(pc, rf, bs, im, dm)$ where $Op(op, rd, v1, v2) := first(bs)$, $itemp := first(deq(bs))$
1312   $if \ itemp \equiv Op(op', rd', v1', v2') \rightarrow Proc_p(pc, (rf[rd := \underline{op}(v1, v2)])[rd' := \underline{op'}(v1', v2')], deq(deq(bs)), im, dm)$
1313   $if \ itemp \equiv Bz(vc, vt) \ \& \ vc \equiv 0 \rightarrow Proc_p(vt, rf[rd := \underline{op}(v1, v2)], clear(bs), im, dm)$
1314   $if \ itemp \equiv Bz(vc, vt) \ \& \ vc \neq 0 \rightarrow Proc_p(pc, rf[rd := \underline{op}(v1, v2)], deq(deq(bs)), im, dm)$
1315   $if \ itemp \equiv Load(rd', va) \rightarrow Proc_p(pc, (rf[rd := \underline{op}(v1, v2)])[rd' := dm[va]], deq(deq(bs)), im, dm)$
1316   $if \ itemp \equiv Store(va, v) \rightarrow Proc_p(pc, rf[rd := \underline{op}(v1, v2)], deq(deq(bs)), im, dm[va := v])$

FIG. 13B

1321 $Proc_p(pc,rf,bs,im,dm)$ where $Bz(vc,vt) := first(deq(bs))$, $itemp := first(bs))$
1322 if $itemp \equiv Op(op,rd,v1,v2)$ & $vc \neq 0$ → $Proc_p(pc,rf[rd:=op(v1,v2)],deq(deq(bs)),im,dm)$
1323 if $itemp \equiv Bz(vc',vt')$ & $vc' \neq 0$ & $vc \equiv 0$ → $Proc_p(vt',rf,clear(bs),im,dm)$
1324 if $itemp \equiv Bz(vc',vt')$ & $vc' \neq 0$ & $vc \neq 0$ → $Proc_p(pc,rf,deq(deq(bs)),im,dm)$
1325 if $itemp \equiv Load(rd,va)$ & $vc \neq 0$ → $Proc_p(pc,rf[rd:=dm[va]],deq(deq(bs)),im,dm)$
1326 if $itemp \equiv Store(va,v)$ & $vc \neq 0$ → $Proc_p(pc,rf,deq(deq(bs)),im,dm[va:=v])$

FIG. 13C

1331 $Proc_p(pc,rf,bs,im,dm)$ where $Load(rd,va) := first(bs)$, $itemp := first(deq(bs))$
1332 if $itemp \equiv Op(op,rd',v1,v2)$ → $Proc_p(pc,(rf[rd:=dm[va]])[rd':=op(v1,v2)],deq(deq(bs)),im,dm)$
1333 if $itemp \equiv Bz(vc,vt)$ & $vc \equiv 0$ → $Proc_p(vt,(rf[rd:=dm[va]],clear(bs),im,dm)$
1334 if $itemp \equiv Bz(vc,vt)$ & $vc \neq 0$ → $Proc_p(pc,(rf[rd:=dm[va]]),deq(deq(bs)),im,dm)$

FIG. 13D

1341 $Proc_p(pc,rf,bs,im,dm)$ where $Store(va,v) := first(bs)$, $itemp := first(deq(bs))$
1342 if $itemp \equiv Op(op,rd,v1,v2)$} → $Proc_p(pc,rf[rd:=op(v1,v2)],deq(deq(bs)),im,dm[va:=v])$
1343 if $itemp \equiv Bz(vc,vt)$ & $vc \equiv 0$ → $Proc_p(vt,rf,clear(bs),im,dm[va:=v])$
1344 if $itemp \equiv Bz(vc,vt)$ & $vc \neq 0$ → $Proc_n(pc,rf,deq(deq(bs)),im,dm[va:=v])$

FIG. 13E

DIGITAL CIRCUIT SYNTHESIS SYSTEM

REFERENCE TO RELATED APPLICATIONS

This application is a continuation of U.S. application Ser. No. 09/377,372, filed August 19, 1999, and which issued U.S. Pat. No. 6,597,664 on Jul. 22, 2003. The content of the prior application is incorporated herein by reference in its entirety.

STATEMENT AS TO FEDERALLY SPONSORED RESEARCH

Funding for the work described herein was provided in part by the federal government, which may have certain rights in the invention.

BACKGROUND

This invention relates to design and synthesis of digital circuits.

Hardware description languages (HDLs) have been used for some time to design electronic circuits, and in particular to design synchronous (clocked) digital circuits. One class of hardware description languages are "register-transfer languages" (RTLs) in which the circuit has, or is abstracted to have, a set of registers, and the language specifies the values of the registers in each clock period in terms of the values in the previous clock period. A widely used HDL is Verilog, which has been standardized as IEEE standard 1364-1995, and for which numerous software tools are available. Verilog supports a variety of specification approaches, including a RTL approach.

Design of complex digital circuits, such as pipelined and superscalar processors, using an RTL approach requires a hardware architect to specify the overall functionality of the system which can be defined in terms of modular components that are defined separately, as well as specify the correct coordination of concurrent processing modules in the circuit. As hardware systems become more complex, for example pipelined processors which allow out-of-order and speculative instruction execution, this task is increasingly time consuming and is subject to human error.

Other HDL approaches attempt to specify a digital circuit in "behavioral" terms, without necessarily identifying the structure of the underlying circuit. For instance, Verilog supports such a behavioral specification approach. However, it is not always possible or feasible to synthesize an equivalent digital circuit from such a behavioral specification.

A variety of software tools are available for processing HDL specifications, including tools for simulating the specified circuits. Formal verification of the correctness of an HDL specification is often difficult, or even impossible, due in part to the nature and complexity of the specification.

SUMMARY

In a general aspect, the invention is a method of specifying and synthesizing a synchronous digital circuit by first accepting a specification of an asynchronous system in which stored values are updated according to a set of state transition rules. For instance, the state transition rules are specified as a Term Rewriting System (TRS) in which each rule specifies a number of allowable state transitions, and includes a logical precondition on the stored values and a functional specification of the stored values after a state transition in terms of the stored values prior to the state transition. The specification of the asynchronous circuit is converted into a specification of an synchronous circuit in which a number of state transitions can occur during each clock period. The method includes identifying sets of state transitions, for example by identifying sets of TRS rules, that can occur during a single clocking period and forming the specification of the synchronous circuit to allow any of the state transitions in a single set to occur during any particular clocking period.

In one aspect, in general, the invention is a method for determining a specification a synchronous digital circuit. The method includes accepting a first specification of a first asynchronous digital system, including accepting a specification of multiple data elements whose values define the state of the system and a first set of state transition rules for the asynchronous digital system. The method then includes determining a specification of a synchronous digital circuit from the specification of the asynchronous digital system, such that during at least some clocking periods the synchronous digital circuit makes a state transition equivalent to state transitions specified by multiple the state transition rules specified for the asynchronous digital system.

The method can include one or more of the following features:

Each state transition rule includes a specification of a precondition that must be satisfied by the state of the system to apply the state transition rule, and a specification of a resulting state that is reached as a result of applying the state transition rule. For instance, the state transition rules are defined as a term rewriting system, and the specification of the synchronous digital system is in a register transfer language.

The method further includes scheduling the state transition rules by identifying one or more sets of conflicting state transition rules. State transitions specified by different rules in one of the conflicting sets may conflict in their access to data elements of the system.

Determining the specification of the synchronous system includes determining the specification such that during any clocking period, the synchronous digital circuit makes states transitions equivalent to at most one state transition rule from each conflicting set of state transition rules.

Determining the specification of the synchronous system includes determining a specification of arbitration logic associated with each conflicting set of state transition rules such that the arbitration logic generates trigger signals that allow at most one state transition rule from the conflicting set of states to be applied in a single clocking period. For instance, the arbitration logic includes a round-robin priority encoder for generating the trigger signals.

The method further includes determining a specification of arbitration logic that generates trigger signals for sets of state transitions rules such that the rules in each of said are applicable in at least some order to the asynchronous digital system.

The method further includes transforming the first specification of the first asynchronous digital system into a second specification of a second asynchronous digital system. The second specification includes a second set of state transition rules, and the second asynchronous digital system includes pipeline. At least some of the first state transitions rules each correspond to multiple of the second state transition rules such that each of these corresponding rules is associated with a different stage of the pipeline.

The method includes adding a number of composite rules to the first specification, wherein each composite rule is associate with multiple of the first state transition rules, and each state transition specified by one of the composite state transition rules is equivalent to a sequence of state transitions each specified by the first set of state transition rules.

Accepting the specification of the data elements further includes accepting a specification of an abstract data type, such as a first-in-first-out queue, and wherein determining a specification of a synchronous digital circuit includes determining an implementation of the abstract data type.

The synchronous digital circuit can implement a computer processor, and state transitions of the asynchronous digital system are associated with changes in values stored in storage elements of the computer processor.

Determining the specification of the synchronous circuit further includes determining a preliminary specification of a digital circuit, and optimizing the preliminary specification a correspondence between the preliminary specification and the specification of the asynchronous digital system.

Aspect of the invention may include one or more of the following advantages:

The approach embodied in the invention allows a hardware architect to develop a specification of an asynchronous system as an initial step to developing a synchronous circuit specification. Specification of the asynchronous system is typically simpler than direct specification of a corresponding synchronous system in part because the architect is relieved of the task of scheduling concurrent operations during clock periods. Furthermore, by not having to deal in low-level implementation tasks, there is less chance of human error.

Use of a Term Rewriting System (TRS) provides a basis for formal verification of system specifications. Furthermore, the TRS provides a basis for automated or semi-automated transformations of a specification, for example, to introduce pipelined or superscalar aspects into the circuit specification.

Use of abstract data types, such as FIFOs or content-addressable memory, also relieves the hardware architect from issues related to low-level design. A circuit realization of an abstract data type can be deferred until later in the design process.

Maintaining a relationship or mapping between a synchronous circuit specification and the initial asynchronous circuit specification simplifies optimization of the synchronous circuit.

The approach can be used to interface to previously designed synchronous modules. In this way, a hardware architect can concentrate on the coordination and interconnection of these predefined modules without having to redesign the modules themselves.

The approach can also be used to design synchronous modules that are then used in other circuit design approaches.

Other features and advantages of the invention are apparent from the following description, and from the claims.

DESCRIPTION OF DRAWINGS

FIGS. 2A–D illustrate storage elements and TRS rules for a first exemplary asynchronous system specification;

FIG. 7 is a set of data type declarations of a system specification;

FIG. 8 is a set of rewrite rules of a system specification;

FIG. 11 is a set of data type declarations for a processor which includes a pipeline buffer;

FIGS. 12A–B are rewrite rules for a system which makes use of a pipeline buffer; and FIGS. 13A–E are composite rewrite rules for a superscalar implementation.

DESCRIPTION

Figure 1:
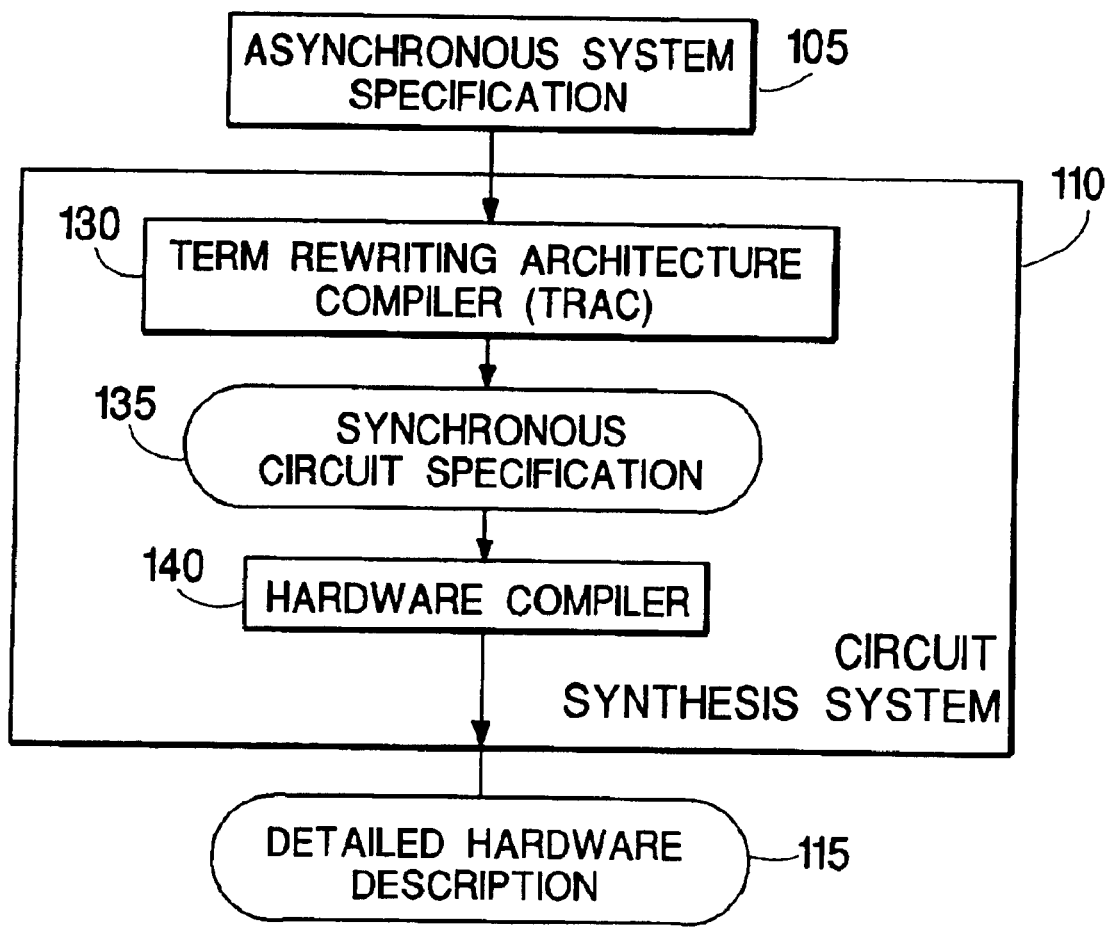
FIG. 1 illustrates processing of an asynchronous system specification to form a detailed hardware description.

Referring to FIG. 1, a circuit synthesis system 110 accepts an asynchronous system specification 105 and produces a detailed hardware description 115, which describes a synchronous (clocked) digital circuit. Circuit synthesis system 110 includes a term rewriting architecture compiler (TRAC) 130, which accepts asynchronous system specification 105 and produces a synchronous circuit specification 135. In this version of circuit synthesis system 110, synchronous circuit specification 135 uses a subset of the Verilog hardware description language (HDL). In particular, synchronous circuit specification 135 uses an RTL subset of Verilog. Synchronous circuit specification 135 passes to a hardware compiler 140, in this instance a Verilog compiler, which produces detailed hardware description 115 as output. Hardware, for example a field programmable gate array, configured according to synchronous circuit specification 135 operates according to asynchronous system specification 105 in that when viewed once per clock period, the operation would be allowed by asynchronous system specification.

In this embodiment, asynchronous system specification 105 is specified in terms of a Term Rewriting System (TRS). Term Rewriting Systems (TRS) can be used for design and verification of processor designs. See, for example, Arvind and X. Shen, "Using Term Rewriting Systems to Design and Verify Processors," MIT LCS Memo CSG-419, *IEEE Micro*, May/June 1999, in which an example of a processor with speculative instruction execution is described.

In the context of asynchronous system specification 105, the content of number of named storage elements defines the state of the asynchronous system. These storage elements correspond to actual or abstract data types. An actual data type is one for which the storage structure and operation is completely known, whereas an abstract data type is defined only in terms of its interface which defines its externally visible behavior. Examples of actual data types include a register that holds a single value. Examples of abstract data types include a array, FIFO queue, content-addressable FIFO, push-down stack, or other storage for multiple values that allows access to some but not necessarily all of the values, or other elements with well-defined interface semantics.

Figures 2A, 2B:
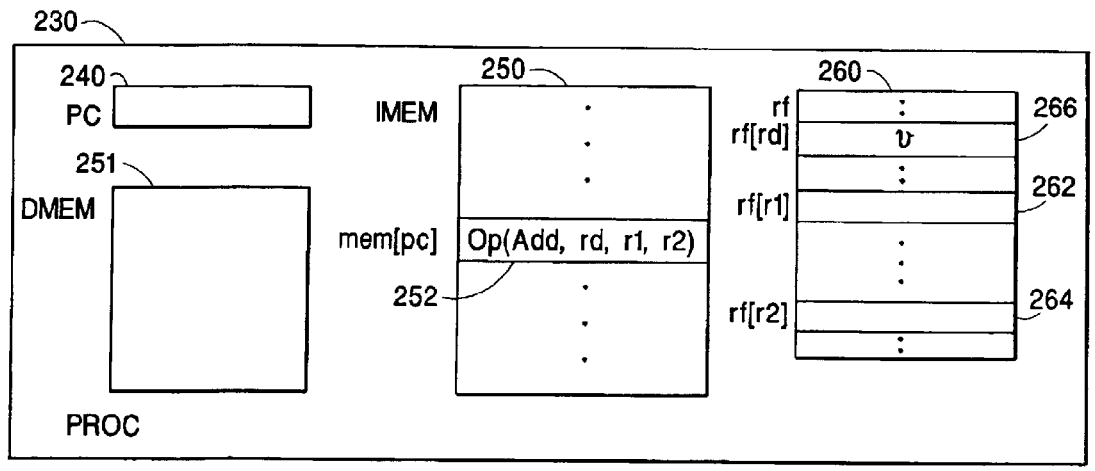

Referring to FIG. 2A, a first exemplary asynchronous system specification 105 characterizes a single-cycle (i.e., not pipelined) processor. The processor has a number of storage elements, including a program counter register, PC 240, an addressable instruction memory, IMEM 250, which holds processor instructions, an addressable data memory, DMEM 251, and a register file, RF 260, which holds data values. These four storage elements are grouped to form PROC 230. Referring to FIG. 2B, asynchronous system specification 105 includes TRS rules 210, which includes a number of individual rules 220 that describe allowable transitions in the values in the storage elements. An exemplary rule 220, the "Add Rule," in TRS rules 210 governs addition of two values stored in register file RF 260. Each rule 220 in TRS rules 210 has a left-hand-side (LHS) term 222, a predicate 224, and a right-hand-side (RHS) term 226. Each rule is, in general, applicable in multiple different arrangements of values in the storage elements (states) of the system as defined by its LHS term 222 and predicate 224. A primitive, or "delta," rule is applicable in only one state. A general rule is a shorthand expressed in terms of variables that represents a number of delta rules. For any rule, its RHS term 226 uniquely specifies new values of the storage elements (the new state) in terms of the values in storage elements at the time the rule was applied. Operation of the specified asynchronous system is based on the assumption that any rule is applied atomically, that is, storage elements are updated according to one rule before a new rule is considered.

In this first example, rule 220 shown in FIG. 2B has the following elements:

```
Rule 220:
LHS term 222
if Predicate 224
→ RHS term 226
Add Rule:
Proc(pc,rf,im,dm)
if im[pc] is Op(Add,rd,r1,r2)
→ Proc(pc+1,rf[rd:=v], im, dm)
    where v=rf[r1]+rf[r2]
```

The term Proco has four positional arguments. Referring to FIG. 2A, the first argument, pc, matches PC 240, the second argument, rf, matches register file RF 260, and the third argument, in, matches instruction memory IMEM 250, and the fourth argument, dm, matches data memory DMEM 251. The exemplary rule shown above is read as "If the system has a term 'Proc(pc,rf,im,dm)' and im at address pc holds an instruction with opcode Add and variable arguments rd, r1, and r2 then the term 'Proc(pc,rf,im,dm)' is replaced (i.e., rewritten) such that pc is replaced with pc+1, and the rd entry of register file rf is replaced with the value v, which is the sum of the r1 entry and the r2 entry of register file rf."

Note that in the rules, arguments such as im and Proc match actual storage elements or defined groups of storage elements, in this case IMEM 250 and Proc 230. The LHS term of a rule can, in general, be matched in multiple ways to storage elements of the system. For example, in a system with multiple identical processors a single rule applicable to a processor could be matched to any of the processors. When a rule can be matched to different storage elements of the system, the rule is essentially treated as separate multiple rule instances of the same rule each with a defined mapping to storage elements.

Two additional rules in this first example are used to specify a branch-if-zero instructions as:

```
Bz-taken rule:
Proc(pc,rf,im,dm)
if im[pc] is Bz(rc,ra) AND rf[rc] is 0
→ Proc(rf[ra],rf,im,dm)
Bz-not-taken rule:
Proc(pc,rf,im,dm)
if im[pc] is Bz(rc,ra) AND rf[rc] is not 0
→ Proc(pc+1,rf,im,dm)
```

The first rule, the "Bz-taken" rule, updates pc with the content of rf[ra] if the content of rf[rc] is zero, while the second rule, the "Bz-not-taken" rule, increments pc if rf[rc] is not zero.

Additional instructions, including move pc to register, load immediate, register-to-register subtraction, and memory load and store, are specified using similarly structured TRS rules. An approach to compilation of these types of rules into a synchronous circuit specification is described fully below.

For any state of the system, in general, multiple but not necessarily all rules can be applied based on their LHS terms and predicates. In this simple example, one way to specify a synchronous implementation of the rules is to "enable" all rules that are applicable to the state at the beginning of each clocking period and to essentially concurrently update the state according the RHS terms of all the rules that are enabled. By concurrently, we mean that the LHS term and the predicate for each rule is evaluated concurrently at the beginning of a clocking period, and the rewrite values in the RHS terms are computed using those initial values, and all updates to the values are performed at the end of a clocking period. Note that, in general, enabling all the applicable rules is not feasible due to possible conflicts, such as multiple rules updating the same location, or a rule updating a value used by another rule. For this simple example, at most one rule is applicable to any particular state of the system, and at most a single state transition therefore occurs in each clocking period.

Figure 3A:
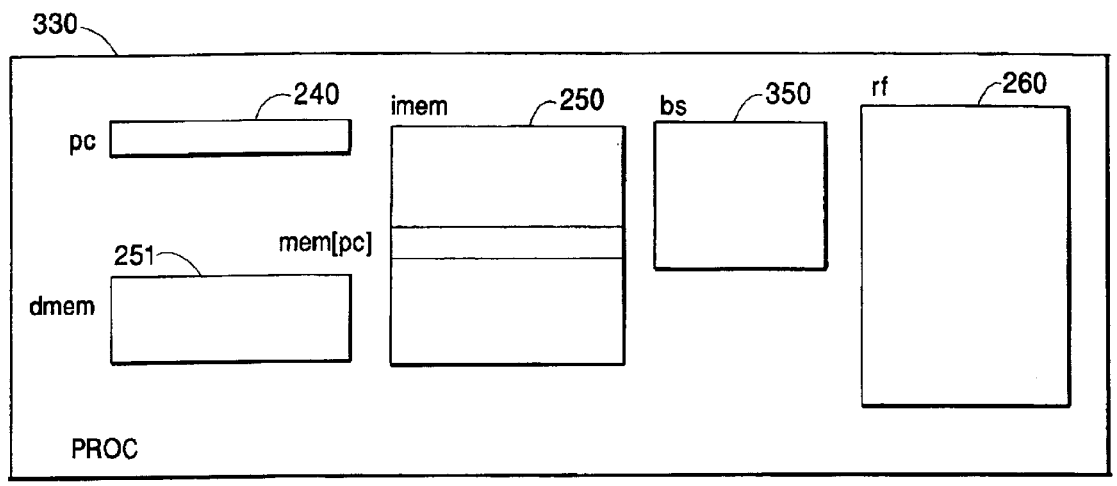
FIG. 3A illustrates storage elements for a second exemplary asynchronous system specification.
Figure 3B:
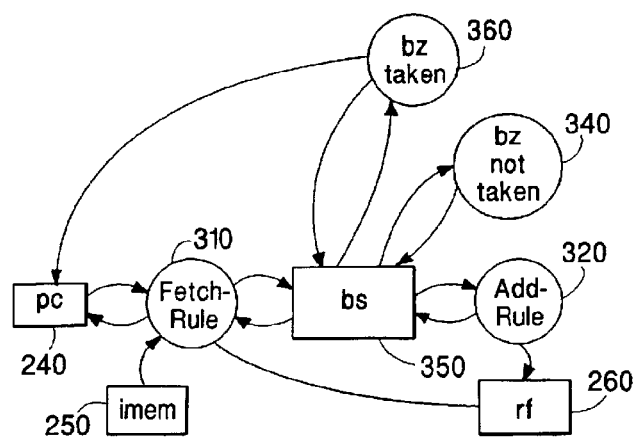
FIG. 3B illustrates dependencies of rules on storage elements.

Referring to FIGS. 3A–B, a second exemplary asynchronous system specification 105 specifies a processor that uses a pipeline buffer BS 350, which is a FIFO queue storage element, into which the processor can fetch an instruction in a clock cycle prior to executing it. The notation for the content of a FIFO is a series of subsequences or values. For example, enqueuing a value a into a FIFO with a prior value bs is denoted enq(bs,a). Similarly, nonEmpty(bs) is a Boolean function that returns true if the FIFO is not empty, that is, if bs has some elements in it. The first element of a nonempty FIFO is referenced as first(bs). The first (least recently enqueued) element of a nonempty FIFO is removed by deq(bs), which is a function whose value is the FIFO with the first element removed.

Referring to FIG. 3A, PROC 330 has five storage elements, in their order as positional arguments in a Proc term: PC 240, RF 260, BS 350, IMEM 250, and DMEM 251. A subset of TRS Rules 210 for this second example is as follows:

```
Fetch Rule 310:
Proc(pc,rf,bs,im,dm)
if im[pc]=inst and Source(inst) does not
intersect Target(bs)
→ Proc(pc+1,rf,bs',im,dm)
```

```
                        -continued
        where bs' is enq(bs,Decode(im[pc]) )
        Add Rule 320:
        Proc(pc,rf,bs,im,dm)
        if first(bs) is Op(Add,rd,v1,v2)
        → Proc(pc,rf[rd:=v],bs',im,dm)
                where v=v1+v2
                      bs'=deq(bs)
        Bz-taken rule 330:
        Proc(pc,rf,bs,im,dm)
        if first(bs) is Bz(vc,va) AND vc is 0
        → Proc(va,rf,<empty>,im,dm)
        Bz-not-taken rule 340:
        Proc(pc,rf,bs,im,dm)
        if first(bs) is Bz(vc,va) AND vc is not 0
        → Proc(pc,rf,bs',im,dm)
                where bs' is deq(bs)
```

The Source( ) Function is a shorthand for extracting the set of source register names from an instruction or a set of instructions. For example Source(Op(Add,rd,r1,r2))={r1, r2}. The Target( ) function is a shorthand for extracting the set of destination register names from the instructions in bs. The Decode( ) function is a shorthand for the decoded version of an instruction where the register operands has been fetched. For example, Decode(Op(Add,rd,r1,r2))=Op (Add,rd,rf[r1],rf[r2])

Notice that Fetch rule 310 is always ready to fire, unless there is a Read-After-Write register dependence in the instruction being issued and the instructions waiting to be completed in bs. If Bz-taken rule 330 is also ready to fire when the Fetch rule is ready to fire, the asynchronous system exhibits non-deterministic behavior since one of these two will be applied and the corresponding state transition will complete before the other rule is applied (if indeed it is still applicable after the first state transition).

Referring to FIG. 3B, each rule in the second example is illustrated with its dependency on values in particular storage elements and with its affect on values in storage elements. Note that Add rule 320, Bz-taken rule 330, and Bz-not-taken rule 340 all affect storage element BS 350, in particular by dequeuing the next instruction from the FIFO. However, these three rules are enabled in disjoint sets of states, in particular, no instruction in BS 350 enables more than one of the rules. However, Fetch rule 310 and Bz-taken rule 330 both update PC 240. Furthermore, there are states in which both rules are enabled, in particular, whenever Bz-taken rule 330 is enabled when Bz-taken is enabled and it is the only instruction in BS. The approach of specifying a synchronous implementation of the rules enabling all the rules in each clocking period does not necessarily produce the expected result. For instance, the race condition of writing the updated value of PC 240 can result if both Fetch rule 310 and Bz-taken rule 330 each enable state transitions that occur in one clocking period. As is described below, an overall strategy used in Term Rewriting Architecture Compiler (TRAC) 130 (FIG. 1) is to attempt to enable multiple rules in each clocking period, without introducing conflicts such as the race condition in updating PC 240 outlined above.

Figure 4:
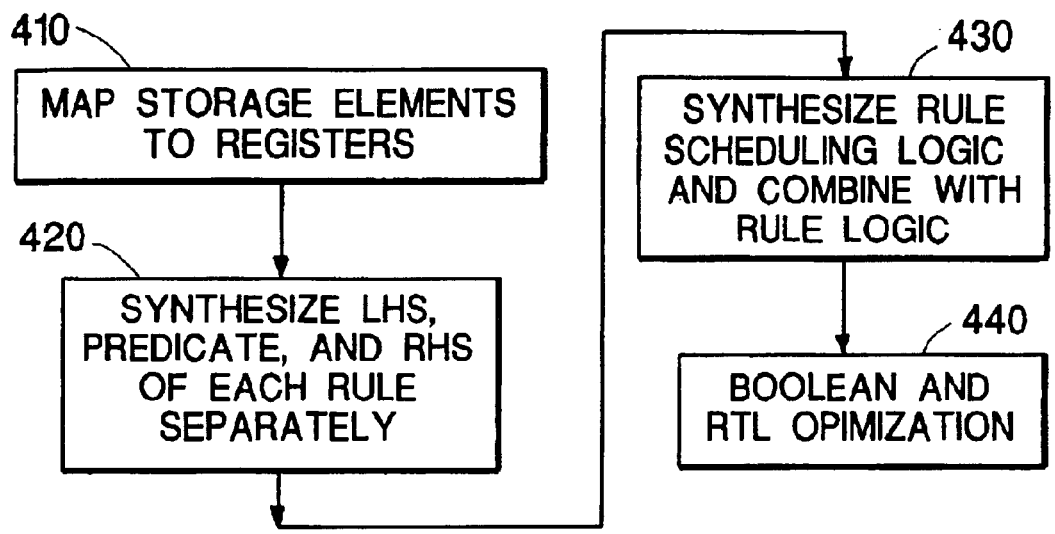
FIG. 4 is a flowchart of the steps carried out by a Term Rewriting Architecture Compiler.

Referring now to FIG. 4, operation of an embodiment of Term Rewriting Architecture Compiler (TRAC) 130 (FIG. 1) involves several steps. First, in step 410, TRAC 130 maps the storage elements specified in asynchronous system specification 105(FIG. 1) into registers, or other predefined circuit elements that internally provide storage. Next, in step 420, TRAC 130 synthesizes the LHS, predicate and RHS of each rule into an internal representation that is essentially equivalent to logic circuits needed to implement these terms. Note that these logic representations associated with each rule are "disconnected" and do not form an overall circuit representation at this step. In step 430, TRAC 130 synthesizes rule scheduling logic and connects the logic synthesized in step 420 with the rule scheduling logic. Finally in step 440, TRAC 130 optimizes the resulting logic producing the final RTL specification.

In step 410, TRAC 130 maps storage elements in asynchronous system specification 105 into actual circuit elements that will hold the values that determine the state of the system. In the case of scalar storage elements, the mapping is directly into a register circuit. Asynchronous system specification 105 includes data type declarations for each of the storage elements. For example, in the case of scalar storage elements can include the number of bits needed in the register circuit. Alternatively, a default number of bits (e.g., 32 bits) can be used. In the case of abstract storage elements, such as a register file or a FIFO queue, TRAC 130 maps these elements into predefined circuit elements that are, for example, provided as library elements in the HDL.

Although an abstract data type may describe an unbounded storage, such as an unbounded length FIFO queue, the circuit elements have bounded storage. In the case of a FIFO queue, at this step TRAC 130 synthesizes circuitry which implements storage for one or more entries, as well as interlocking circuitry prevents writing into a full FIFO. Note that in an asynchronous system, a full FIFO cannot be written to. In a synchronous implementation, a full FIFO can be written to in a clocking period as long as an entry is dequeued in the same period. In this way, a FIFO queue may be implemented using a single register and interlocking logic that prevents writing into the register only if the resister is holding a value that has not been dequeued, and that value is not dequeued in the clock period. Using this approach, the specification of the asynchronous system in terms of an unbounded FIFO is not complicated by including the function of the interlocking logic in each rule that may enqueue a value in the FIFO, while ensuring proper operation for the synchronous system which uses a finite length FIFO, or even a single register.

Optionally, at this step, TRAC 130 optimizes storage by identifying particular storage elements that can share registers, thereby reducing the amount for storage circuitry that is needed in the synthesized circuit.

In step 420, TRAC 130 synthesizes logic to implement the LHS and predicate and the RHS of each rule. Formally, for a rule i, TRAC 130 computes two logical expressions, $\pi_i(s)$ and $\delta_i(s)$. The term s represents the state of the system, that is, the values in all the storage elements. The term $\pi_i(s)$ is a logical (Boolean) function which is true if rule i is enabled in state s, that is, if the rule's predicate is true, and the LHS of the rule matches the state. The term $\delta_i(s)$ defines the new values for the storage elements, that is, the next state, if the rule is applied.

In step 430, TRAC 130 synthesizes rule scheduling logic and combines this logic with that defined by the ni(s) and $\delta_i(s)$ synthesized in step 420. As a first part of this step, TRAC 130 identifies "conflict-free" rules in TRS rules 210 of asynchronous system specification 105. It is desirable to identify as many rules as possible that are known not to conflict so that they can be enabled to fire in a single clocking period without interfering with one another. One approach taken by TRAC 130 is to identify sets of potentially conflicting rules such that each rule in a particular set is known to possibly conflict with at least one other rule in that set, and known to not conflict with any rules outside that set. In any clocking period, one of each set of potentially conflicting rules, and all rules that do not conflict with any other rule can safely be fired simultaneously. Arbitration logic is used to prevent more than one rule in each potentially conflicting set from being applied concurrently in one clocking period.

Alternatively, TRAC 130 enables more than one rule from a potentially conflicting set. For example, consider the case in which a rule A conflicts with rule B and separately conflicts with rule C, but rules B and C do not themselves conflict. In the first approach described above, at most one of rules A, B, and C are enabled, thereby ensuring the neither both A and B nor both A and C are enabled. In this alternative approach, the actual conflicts in a potentially conflicting set are essentially enumerated in the synthesized system, so that both B and C can be enabled. One approach to this synthesis is to define combinational logic that accepts a subset of applicable rules and outputs a potentially smaller subset of rules that can be enabled without conflict. For the three-rule example, if all rules A, B, and C are applicable, the logic might enable B and C but not A. A tradeoff in this approach is that although more rules might be enabled per clocking period, significantly more resources are required to enumerate the non-conflicting subsets than to identify a potentially conflicting set as a whole.

The more rules that are enabled, the more potential parallel processing is achieved. In this embodiment, sets of potentially conflict free rules are identified in two steps. In one alternative approach each pair of rules is examined to determine whether there are any state of the system in which both rules are be enabled. TRAC 130 does this by examining the LHS terms and predicates of each of the pairs of rules and logically proving that a state exists that would enable both rules. In another alternative, rather than definitely proving that a state exists that enables both rules, a conservative approach is taken in which if TRAC 130 cannot prove that definitely no state exists that enables both rules, it assumes that such a state may possibly exist.

For any pair of rules that are or may possibly be both enabled in a state, then for the rules not to conflict the order of enabling the two rules in sequence should not affect the resulting state transition after enabling both rules. First, for any state in which both rules are enabled, each rule must continue to be enabled after the state transition defined by the other rule. Second, the order of the state transitions must not affect the resulting state after both transitions. The storage elements that are updated by the RHS terms of the rules are compared, and if there is any storage element in common, the two rules are assumed to be in conflict. Even if there are no storage elements in conflict, if the result of performing the state update specified by the RHS term of one rule might affect the result of performing the state update of the other RHS term, for example by modifying the operands of that RHS term, then the two rules are also assumed to be in conflict. In this way, essentially simultaneous execution of two conflict-free state update is equivalent to sequential execution and enabling to the two state updates.

This conflict-free condition between two rules can be stated formally as follows. Consider two rules, i and j.

Let s be the state of the system in terms of the values in all the storage elements of the system. As outlined above, the logical function $\pi_i(s)$ is true for a state s if the LHS terms and the predicate for rule i would enable the state transition defined by rule i, and the value of the state after that transition would be $\delta_i(s)$. Two rules cannot both be enabled in any state s if $\pi_i(s) \wedge \pi_j(s)$ false for all states s, and therefore would not be in conflict. If $\pi_i(s)$ and $\pi_j(s)$ are both true for some state s, then both $\pi_i(\delta_j(s))$ and $\pi_j(\delta_i(s))$ must also be true to satisfy the requirement that both rules remain enabled after the state transition enabled by the other rule. Furthermore, the order of affecting the updates must not depend on the order of the updates $\delta_i(\delta_j(s))=\delta_j(\delta_i(s))$, which is the case if the two rules update different storage elements and one rule does not update the operands of the other rule's RHS term. Note that concurrent application of a set of non-conflicting rules in a synchronous implementation is equivalent to any sequence of application of those rules in the specified asynchronous system. In an alternative approach described below, the conflict-free requirement is relaxed to essentially allow a set of rules to be applied concurrently in the specified synchronous system if there is at least some order of application of the rules in the asynchronous system that achieves the same result.

Even when two rules may conflict, and state transitions are enabled by these rules both update the same storage element, one rule may "dominate" the other. For instance, if two rules may both be enabled in some states, that is, $\pi_i(s) \wedge \pi_j(s)$ is true in states s, if $\pi_i(\delta_j(s))$ is true and $\delta_i(\delta_j(s))= \delta_i(s)$ for all states s for which both are enabled, then rule i is said to dominate rule j since even if rule j were to be enabled, subsequent firing of rule i would erase the effect of the prior firing of rule j. Therefore, conceptually, rule i can be enabled after rule j in a clocking period in which both would be enabled. In the case of a synchronous circuit, if both rules i and j would enable state transitions, only the dominant state transition is acted upon and the result is equivalent to having performed the dominant state transition after the other state transition.

Figure 5:
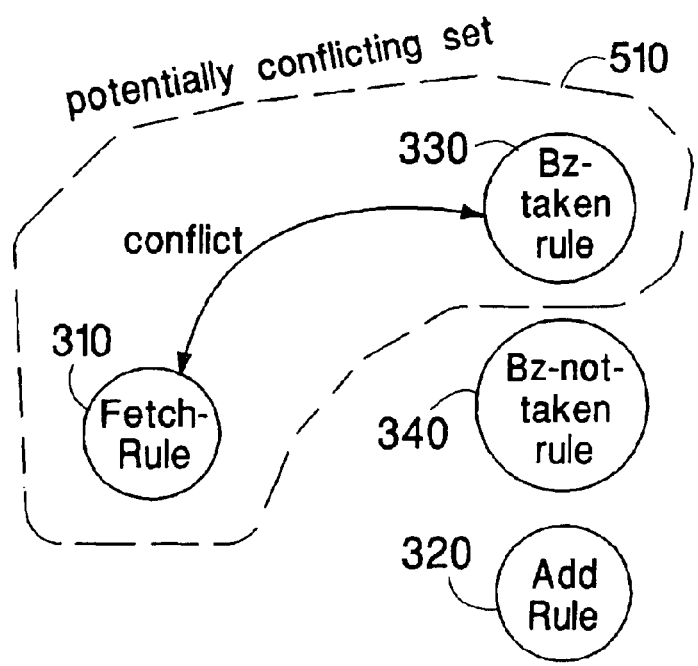
FIG. 5 illustrates exemplary sets of potentially conflicting rules.

Returning to the second example illustrated in FIG. 3B, the conflict free relationship for the exemplary rules is illustrated in FIG. 5. Fetch rule 310 and Bz-taken rule 330 conflict because of the race updating PC 240 (FIG. 3B). Potentially conflicting set 510 is made up of fetch rule 310 and Bz-taken rule 330. The remaining rules do not conflict with any other rules.

Note that Bz-taken rule 330 dominates Fetch rule 310 under the definition stated above, and therefore in states in which both rules would enable state transitions, only Bz-taken rule 330 need be executed.

Figure 6A:
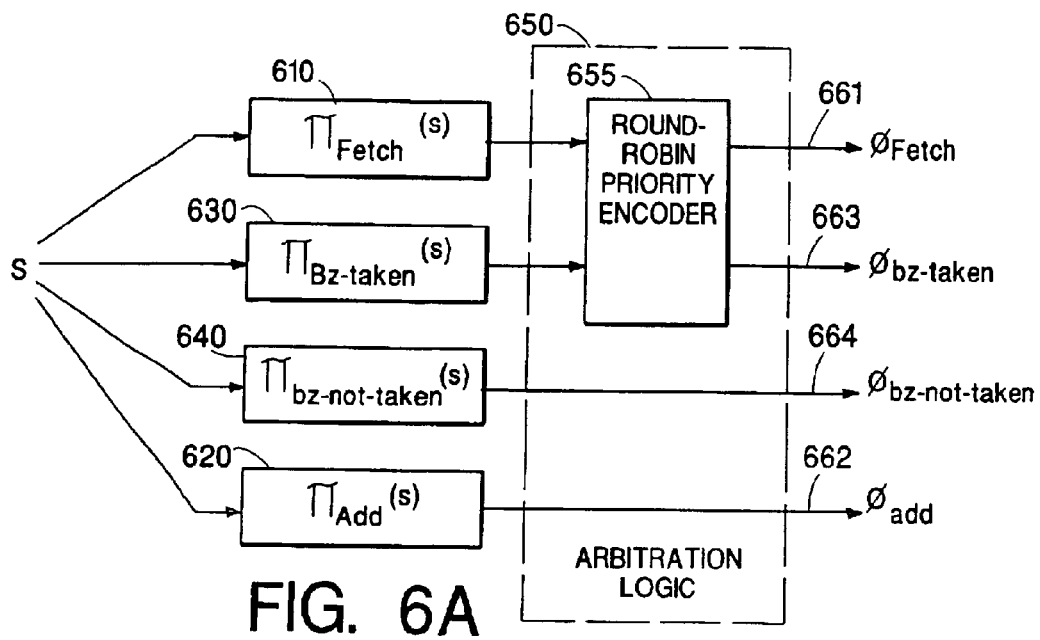
FIGS. 6A–B illustrate arbitration logic which generates trigger signals for rules.

Turning to FIG. 6A, TRAC 130 synthesizes arbitration logic 650 that takes as input output $\pi_i(s)$ from each rule i, and outputs $\phi_i$, a trigger signal for rule i. The $\phi_i$ are such that for any potentially conflicting set of rules, at most one rule from that set has a trigger signal asserted. That rule is selected in a fair manner, for example in a priority round-robin manner, from the rules in the set for which $\pi_i(s)$ is true. Arbitration logic 650 also takes into account dominance of one rule over another so that if dominant rule and the dominated rule can both fire, the dominant rule is chosen over the dominated rule, regardless of fairness. In FIG. 6, which corresponds to the second example above, combinational logic 610, 620, 630, and 640, implementing $\pi_{Fetch}(S)$, $\pi_{Add}(S)$, $\pi_{Bz\text{-}taken}(S)$ and $\pi_{Bz\text{-}not\text{-}taken}(S)$ respectively.

Referring still to FIG. 6A, the $\pi_i(s)$ signals are fed to arbitration logic 650. In this example, there is only one set of potentially conflicting rules, which includes the Fetch rule and the Bz-taken rule. Therefore the outputs $\pi_{Fetch}(s)$ from combinational logic 610 and $\pi_{Bz\text{-}taken}(s)$ from combinational logic 630 are fed to round-robin priority encoder 655. In this single example, the dominant relationship between Bz-taken rule 330 and Fetch rule 310 is used to trigger Fetch rule 310 unless Bz-taken rule 330 is also to be triggered.

Figure 6B:
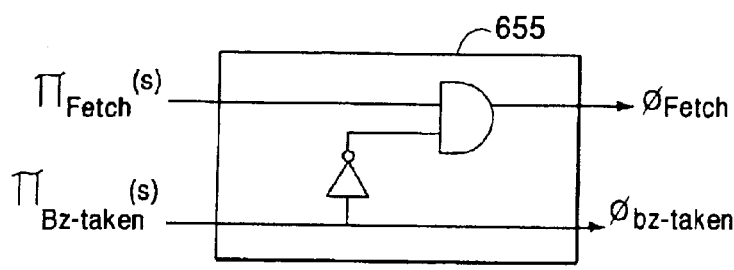

Referring to FIG. 6B, arbitration logic 650 for this example is particularly simple, with the Fetch rule being arbitrated only if the Bz-taken rule is enabled, and arbitration logic 650 generating enable signals for the other rules whenever they are enabled. In a final part of step 430, TRAC 130 combines the outputs $\delta_i(s)$ through multiplexers that are used to select the outputs of appropriate bi(s) functions which the multiplexers then feed the selected output to the registers.

Figure 6C:
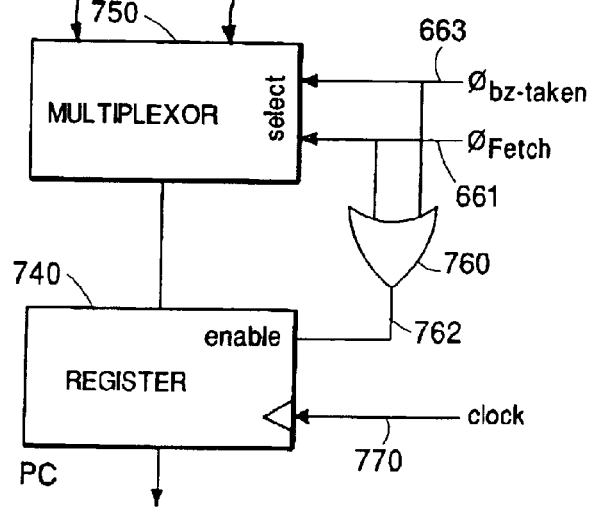
FIG. 6C illustrates a potion of a circuit specification which makes use of the trigger signals.

Referring to FIG. 6C, a portion of the resulting synchronous circuit specification 135 (FIG. 1) produced by TRAC 130 is shown for the second example above. Trigger signals $\phi_{Bz\text{-}taken}(s)$ 663 and $\phi_{Fetch}(S)$ 661 are generated by arbitration logic 650, as shown in FIG. 6A, and fed to the select inputs of a multiplexor 750. Combination logic 730, and 720, implementing $\delta_{Bz\text{-}taken}(s)$ and $\delta_{Fetch}(S)$, respectively, generate outputs that are fed to multiplexor 750. Multiplexor 750 selects one of these two outputs based on its select input, and feeds the selected signal to register 740, which implements storage for PC 240 (FIG. 2). Register 740 is enabled by a latch enable signal 762 that is generated by an OR logic 760 based on the trigger signals 661 and 663 that are fed to multiplexor 750. Register 740 also receives a clock 770 so that in a clock period in which either Bz-taken rule 330 or Fetch rule 310 are enabled, register 740 is updated with the appropriate one of $\delta_{Bz\text{-}taken}(S)$ or $\delta_{Fetch}(s)$.

In an alternative approach, TRAC 130 uses an approach that may allow a greater number of rules to be concurrently enabled than using the conflict-free and dominance conditions described above. Generally, the approach is to identify a set of applicable rules when concurrently applied corresponds to some order of sequential application of the same rules, but does not necessarily correspond to any order of application of those rules. Since the asynchronous system that is specified is inherently non-deterministic, a valid synchronous implementation of the system must execute such that its sequence of states corresponds to some valid sequence of states of the asynchronous system. However, to be a valid implementation, the synchronous system is not required to be able to exhibit all possible state sequences. For example, consider the case in which rule A uses the value of register X to update the value of register Y, while rule B does not use the value of register Y but does update the value of register X. There is a possible conflict between the update by rule B and the input by rule A. A valid concurrent application of rules A and B would be one that is equivalent to application of rule A prior to rule B. In this example, rules A and B are not conflict-free: although $\pi_A(s)$ and $\pi_B(s)$ may both be true for some state s, $\pi_A(s))$ is not necessarily true, and $\delta_A(\delta_B(s))$ is not necessarily equal to $\delta_B(\delta_A(s))$.

Formally, subsets of rules that may be concurrently enabled is defined in terms of a property terms "strong transparency" between pairs of rules. Specifically, a rule A and a rule B are strongly transparent, denoted A<<B, if concurrent application of rules A and B is equivalent to sequential application of rules A then B in the asynchronous system. This property can be written as follows: if $\pi_A(S)$ $\wedge \pi_B(s)$ in a state s, then $\pi_B(\delta_A(S))$ must be true, and $\delta_B(\delta_A(s))$ must be equivalent to concurrently updating the state s according to both rules A and B. For comparison, the conflict-free condition between two rules A and B is equivalent to both A<<B and B<<A. Using this property, a set of rules is concurrently executable if there is at least one sequence of these rules such that each rule in the sequence is strongly transparent (for all applicable states) to all rules that succeed it in the sequence. TRAC 130 synthesizes arbitration logic such that given a set of applicable rules in a state, the enabled rules correspond to some valid sequence of rules according to the strong transparency property.

In the following description, the approach described above is applied to another example, which involves the task of specifying a simple processor, then specifying a pipelined version of the processor and finally specifying a superscalar version of the processor. An aspect of this last transformation, from pipelined to superscalar, makes use of a rule composition property of TRS specifications. The rule-composition property allows new rules to be derived by composing existing rules without introducing illegal behaviors to the system.

An architect starts by formulating a high-level specification of the processor's instruction set architecture (ISA) as a TRS. The goal at this stage is to define an ISA as precisely as possible without injecting implementation details. From such a description, the architect, using TRAC 130, generates a RTL (Register Transfer Language) description of a single-issue, in-order, non-pipelined processor. The generated RTL can be simulated and synthesized by commercial tools.

Next, the architect manually transforms the ISA's TRS description into another TRS that corresponds to a pipelined microarchitecture. In this step, the architect makes high-level architectural decisions such as the locations of the pipeline stages. FIFO queues are introduced between pipeline stages, thereby making many of the rules local to particular pipeline stages and not conflicting with rules local to other pipeline stages. A rule typically dequeues a partially executed instruction from one FIFO queue, computes on it using only local information, and enqueues it into the next FIFO. The architect is also responsible for exposing and resolving any data and control hazards introduced by pipelining. To guard against possible errors introduced during this manual transformation, a semiautomatic verification technique is optionally used to show the correctness of the pipelined TRS against the original ISA specification using state-simulation techniques. Using TRAC 130, the architect takes the asynchronous specifications and generate RTL's for synchronous pipelines.

Finally, the architect transforms the pipelined TRS into a superscalar TRS by devising composite rules. The effect of a composite rule is to apply more than one pipeline rule at each stage of the pipeline. As is described further below, this rule composition can optionally be done automatically once the degree of "superscalarity" is specified. The correctness of the resulting transformation is guaranteed because the rules derived by rule composition are always correct by TRS semantics.

Both pipelining and superscalar transformations are source-to-source in the TRS language and the resulting TRS descriptions can be compiled into Verilog RTL descriptions using TRAC 130. Throughout the design flow, the architect can compile intermediate designs. The architect can evaluate the RTL's of these compiled intermediate designs to steer design decisions in successive refinement steps. For instance, a tool, such as the commercially available Synopsys RTL Analyzer, is used to analyze the size and speed of the circuit designed from the RTL description. In addition, the operation of the processor on sample programs can be examined using a commercial Verilog RTL simulator. Based on the prompt feedback from these tools, the architect can rapidly explore a large number of architectural options and trade-offs.

Returning now to the architect's first step in the example, he first specifies a single-issue, in-order, non-pipelined processor that implement a desired instruction set architecture. In this example, programmer visible state of the processor consists of a program counter, a register file, instruction ROM (read-only memory) and data RAM (read-write memory). Referring to FIG. 7, the programmer-visible state is represented using the terms generated of the types listed in lines 701 through 715. Type PROC (line 701) is a product type with the constructor symbol Proco and four fields. The declaration of type INST (line 709) demonstrates the use of an algebraic union to represent the processor instruction set. For simplicity, the program and data memory are modeled as storage arrays internal to the processor. Optionally, the memory arrays are replaced by external memory interfaces represented as FIFO's prior to synthesis of a final circuit.

Referring to FIG. 8, a set of rewrite rules define processor's dynamic behavior. For brevity, the LHS is listed only once (line 801) and is the same for all the rules. Also, the rule at line 804 is a shorthand for the rules for all arithmetic operations, op, that take two register values and puts the result of applying the appropriate function op(,) to the two register arguments. For example, the following rule describes the effect of executing an Add instruction.

```
Proc(pc,rf,im,dm)
if im[pc]=Op(Add,rd,r1,r2)
→ Proc(pc+1,rf[rd:=rf[r1]+rf[r2] ],im,dm)
```

The predicate is true if the program counter points to an instruction memory location containing Op(Add,rd,r1,r2). When a term satisfies both the LHS template and the predicate, the rule's RHS rewrite template specifies that the pc field should be incremented by 1 and register rd should be updated by rf[r1]+rf[r2].

Figure 9:
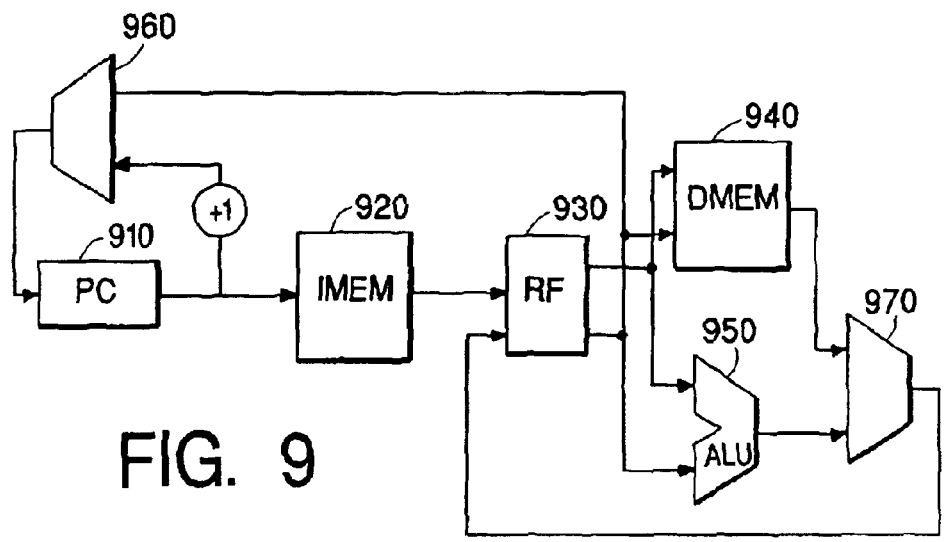
FIG. 9 is a logical structure of a processor defined by the system specification.

Referring to FIG. 9, when synthesized, this TRS corresponds, at least logically from the point of view of a programmer, to the datapaths shown. PC 910 is a register that stores the program counter which is used to retrieve instructions from instruction memory, IMEM 920. Instructions from IMEM 920 are used to address particular registers in register file RF 930. The values from RF 930 are fed to an ALU 950, to data memory, DMEM 940, or to a selector 960 that determines the next value of PC. A selector 970 selects a value from ALU 950 or DMEM 940 to store in a register in RF 930.

In the next step, the architect rewrites the TRS specification shown in FIG. 11 by essentially splitting rules into subrules that provide the same overall functionality from the point of view of a programmer, with the intention that multiple subrules may execute in parallel and that the implemented processor may execute instructions at a higher overall rate.

Figure 10:
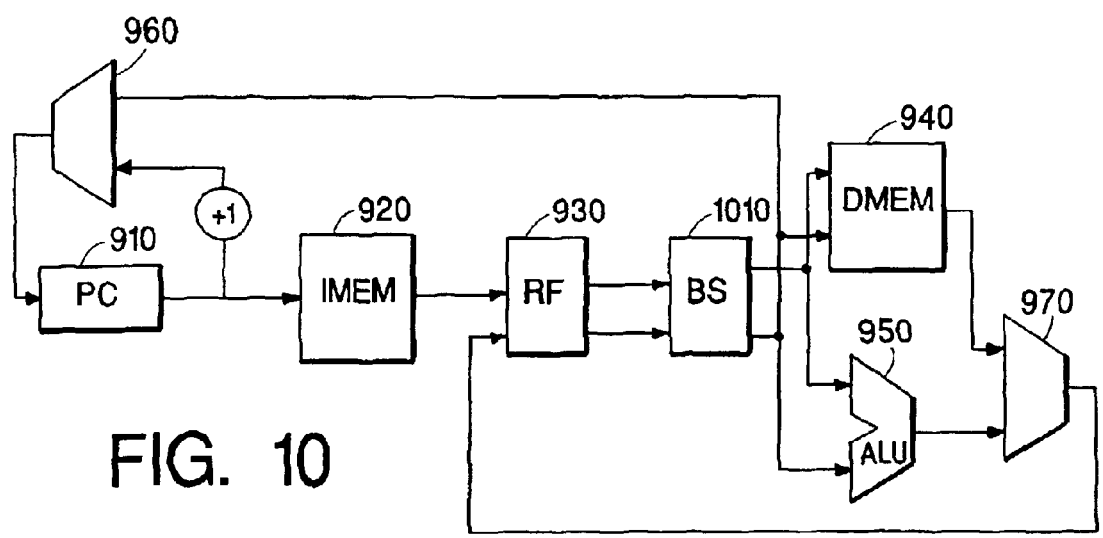
FIG. 10 is a logical structure of a processor which includes a pipeline buffer.

Referring to FIG. 10, the datapaths shown in FIG. 9 are modified to include a FIFO queue BS 1010 between register file RF 930 and ALU 950. The FIFO queue is used to buffer partially decoded instructions in which the operand values have been fetched from RF 930 but the operation has not yet been performed.

Referring to FIG. 11, the architect modifies the system specification shown in FIGS. 7–8 for pipelined operation corresponding to the datapaths shown in FIG. 10. In FIG. 11, type PROCP, defined in line 1101, contains a new field, the FIFO queue BS 1010, to hold instructions after they have been decoded and the operands have been fetched.

Referring to FIG. 12A, all of the processor rules can be partitioned into separate fetch and execute rules to represent a two-stage pipeline. Lines 1201–1203 are a generic fetch rule. Splitting a rule into smaller rules destroys the atomicity of the original rule and thus, can cause new behaviors which may not conform to the original specifications. Therefore, in addition to determining the appropriate division of work across the stages, the architect must also resolve any newly created hazards. The predicate at line 1202 has two terms, one that identifies the particular instruction, inst, and a second term that guarantees that the source operands of the instruction, denoted in shorthand as Source(inst), are not also the target of any instruction already enqueued in bs, denoted in shorthand as Target(bs). This second term inhibits fetching when a read-after-write (RAW) hazard exists. If the architect were to make a mistake in the transformation, the error would be revealed when an attempt is made to verify the equivalence of the pipelined processor against the initial specification via TRS simulation. The RHS, at line 1203, includes the shorthand Decode(inst), which refers to the instruction decoded with its operand values already fetched. Referring to FIG. 12B the execute rules for the ISA make use of the prefetched instructions enqueued in BS 1010. The LHS is shown once in line 1211 for the predicates and RHSs shown in lines 1212–1216. For example, considering the pair of Bz rules shown in FIG. 8, lines 805–806 which describe the effect of branch taken versus not taken conditions in the version without a FIFO buffer, the architect splits these rules into their fetch (instances of the generic fetch rule at lines 1201–1203) and execute components. Both rules share the same fetch rule. In the fetch phase, the processor performs a weak form of branch speculation by incrementing pc without knowing the branch resolution. Consequently, in the execute phase, if the branch is resolved as taken (execute rule at line 1213), besides restarting pc at the correct value, speculatively fetched instructions in BS 1010 are discarded by setting bs to <empty> in the Bz-taken rule at line 1213.

In the third step, the architect rewrites the rules in such a way that multiple instructions can be processed in a pipeline stage in one clock cycle. To achieve two-way superscalar execution, the architect composes two rules that specify operations in the same pipeline stage into a new composite rule that combines the state transitions of both rules. Since the TRAC compiler generates RTL that executes the transitions of a rule in a single clock cycle, the compilation of composite rules results in RTL that can execute two instructions at a time.

In order to illustrate this approach, consider the fetch rules shown generically in FIG. 12A at lines 1201–1203. Bz-fetch and Op-fetch rules that are instances of this generic rule can be written as:

```
Bz-fetch rule:
Proc_p(pc,rf,bs,im,dm)
if im[pc] is Bz(rc,rt) AND rc not in Target(bs)
        AND ra not in Target(bs)
→ Proc_p(pc+1,rf,bs'),im,dm)
        where bs'=enq(bs,Bz(rf[rc],rf[rt] )
Op-fetch rule:
Proc_p(pc,rf,bs,im,dm)
if im[pc] is Op(op,rd,r1,r2) AND
        r1 not in Target(bs) AND
        r2 not in Target(bs)
→ Proc_p(pc+1,rf,bs',im,dm)
        where bs'=enq(bs,Op(op,rd,rf[r1],rf[r2] ) )
```

The Bz-fetch rule rewritten as if it was being applied to the term on the RHS of the Op-fetch rule takes the form of the following rule:

```
Bz-fetch-1 rule:
Proc_p(pc+1,rf,bs',im,dm)
if im[pc+1] is BZ(rc,rt)
    AND bs'=enq(bs,Op(op,rd,rf[r1],rf[r2]) )
    AND rc not in Target(bs')
    AND ra not in Target(bs')
    → Proc_p( (pc+1)+1,rf,bs",im,dm)
    where bs"=enq(bs',Bz(rf[rc],rf[rt]) ) ,
```

Bz-fetch-1 rule is more specific than the general Bz-fetch rule because it requires BS to contain a partially executed Op instruction. Now we can combine the effect of the Op-fetch and Bz-fetch-1 rules into a single atomic rule as follows:

```
Op/Bz-fetch rule:
Proc_p(pc,rf,bs,im,dm)
if im[pc] is Op(op,rd,r1,r2)
    AND r1 not in Target(bs)
    AND r2 not in Target(bs)
    AND im[pc+1] is Bz(rc,rt)
    AND rc not in Target(bs')
    AND ra not in Target(bs')
        where bs'=enq(bs,Op(op,rd,rf[r1],rf[r2]) ) )
    → Proc_p( (pc+1)+1,rf,bs",im,dm)
        where bs"=enq(bs',Bz(rf[rc],rf[rt]) ) )
```

The above Op/Bz-fetch rule is an example of a derived rule, that is, it is a rule that is be derived from other TRS rules. A derived rule is guaranteed to be correct, that is, it cannot introduce observable behaviors which were not permitted by the original rules. However, if the derived rule replaces the rules from which it was derived, the system may not show some behaviors which were permitted otherwise. Although this error does not lead to illegal state transitions, it could result in a deadlock. Hence, unless other provisions are made, each new composite rule is simply added to the original set of rules and does not, in general, replace any of the original rules.

The TRAC compiler, in general, synthesizes very different circuits for composite and non-composite rules. Since the effect of a composite rule takes place in one cycle, significantly more resources and circuitry are required to implement composite rules. Using its understanding of the abstract data type operations, the compiler also tries to simplify the predicate. For example, the predicate in the above Op/Bz-fetch rule can be simplified as follows:

```
Op/Bz-fetch rule:
Proc_p(pc,rf,bs,im,dm)
if im[pc] is Op(op,rd,r1,r2)
    AND im[pc+1] is Bz(rc,rt)
    AND r1 not in Target(bs)
    AND r2 not in Target(bs)
    AND rc not in Target(bs)
    AND rt not in Target(bs)
    AND rc not equal rd
    AND rt not equal rd
    → Proc_p( (pc+1)+1,rf,bs',im,dm)
        where bs'=enq(enq(bs,Op(op,rd,rf[r1],rf[r2]) ) ),
            Bz(rf[rc],rf[rt]) ) )
```

Complete superscalar fetching of all possible instruction pairs would require the composition of all combinations of the original fetch rules from the 2-stage pipelined microarchitecture. In general, given a pipeline stage with N rules, a superscalar transformation leads to an $O(N^s)$ increase in the number of rules where s is the degree of superscalarity. Fortunately, the mechanical nature of this tedious transformation is handled by a computer aided synthesis system. Superscalar transformation also implies duplication of hardware resources such as register file ports, ALU's and memory ports. Hence, one may not want to compose all combinations of rules in a stage. For example, we may not want to compose any other execute rules with memory load or store rules if the memory interface can only accept one operation per cycle.

Abstractly, the procedure for forming a composition of rules $r_1$ and $r_2$, where the rules are written as

```
Rule r_1:
s_1
if p_1,
→ s'
Rule r_2:
s_2
if p_2
→ s_2'
``` is formed by first rewriting rule $r_2$ to be directly applicable to the RHS of rule $r_1$ as follows:

```
Rule r_2:
s_1'
if p_2'
→ s_2"
```

This yields the composite rule

```
Rule r_1/r_2:
s_1
if p_1 AND p_2'
→ s_2"
```

To transform the 2-stage pipelined microarchitecture into a two-way superscalar microarchitecture involves derivation of a composite rule for each pair in the cross product of rules for each pipeline stage.

Referring to FIG. 13A, a generic version of a superscalar fetch rule is shown, corresponding to a composition of two instances of the generic fetch rule shown in FIG. 12A.

Referring to FIG. 13B, composition of Op rules, line 1212 in FIG. 12B, and any of the other execution rules shown in FIG. 12B can always be executed as shown in lines 1311–1316. Note that most rules shown in FIG. 13B require additional read ports in the register file, RF 930. Some combinations also require two write-ports.

There is no valid composition because the RHS of Bz-taken rule (line 1213 in FIG. 12B) produces an empty FIFO queue. Every execute-stage rule in FIG. 12B requires the FIFO queue BS to satisfy the condition notEmpty(bs) and the variable inst is bound to first(bs).

Referring to FIG. 13C executing a Bz-not-taken rule (line 1214 in FIG. 12B) has no side-effects other than removing its template from the head of bs. Hence, composing a Bz-not-taken rule with any other rule produces a composite rule that is nearly identical to the second rule in the composition. This is true even if the second rule being composed is Bz-taken or Bz-not-taken. The composite rules shown in FIG. 13C correspond directly to the basic rules in FIG. 12B.

Referring to FIG. 13D, since we have assumed a single ported memory, DMEM 940, it is not possible to compose a memory access rule (Load or Store) with another memory access rule. The composition of a Load rule with the non-memory access basic rules shown in lines 1212–1214 in FIG. 12B are shown in FIG. 13D. The composition of a Store rule with these basic rules is shown in FIG. 13E.

Note that these composite rules, shown in FIGS. 13A–E do not replace the original rules shown in FIGS. 12A–B. For instance, all five rules shown in FIG. 12B are needed in case there is only one instruction in BS.

In an alternative embodiment, the approach described above is used in conjunction with predefined modules for which synchronous hardware specifications are already available. An interface is defined for each of these modules, and the asynchronous system is specified in terms of these interfaces. This allows the architect to focus on the task of interconnecting and coordinating the modules separately from defining the internal aspects of the modules themselves. Examples of such predefined modules include memory units, such as multi-ported register files of cache memory units, and functional units, such as arithmetic units. Similarly, in yet another alternative embodiment the approach described above is used to design a synchronous circuit that forms a module that will later be incorporated into an overall system using any of a number of design approaches for synchronous circuits.

It is to be understood that while the invention has been described in conjunction with the detailed description thereof, the foregoing description is intended only to illustrate particular embodiments of the invention and not to limit the scope of the invention, which is defined by the scope of the appended claims. Other aspects, advantages, and modifications are within the scope of the following claims.

What is claimed is:

1. A method for designing a synchronous digital system comprising:

accepting specifications of a plurality of data elements whose values define a state of the synchronous digital system and specifications of a plurality of state transition rules, wherein application of at least some of the state transition rules updates values of the data elements according to the specification of said state transition rule; and computing a specification of the synchronous digital system such that at least some state transitions of the synchronous digital system each corresponds to application of a group of two or more of the state transition rules, wherein at least some of the groups of state transition rules each includes rules that potentially conflict in their access to the data elements.

2. The method of claim 1 wherein computing the specification of the synchronous digital system includes identifying the rules that potentially conflict in their access to the data elements.

3. The method of claim 1 wherein computing the specification of the synchronous digital system includes determining for a group of rules that are all enabled in a first state of the synchronous digital system whether a second rule of the group of rules remains enabled in a second state resulting from application of a first rule of the group of rules in the first state.

4. The method of claim 1 wherein computing the specification of the synchronous digital system includes, for each of the at least some of the groups of state transition rules, identifying a sequence of rules such that application of said sequence of rules corresponds to a single transition of the synchronous system.

5. The method of claim 4 wherein identifying the sequence of the rules includes determining whether rules in the sequence remained enabled after application of a prior enabled rule in the sequence.

6. Software stored on a computer-readable medium for designing a synchronous digital system comprising instructions for causing a computer system to:

accept specifications of a plurality of data elements whose values define a state of the synchronous digital system and specifications of a plurality of state transition rules, wherein application of at least some of the state transition rules updates values of the data elements according to the specification of said state transition rule; and compute a specification of the synchronous digital system such that at least some state transitions of the synchronous digital system each corresponds to application of a group of two or more of the state transition rules, wherein at least some of the groups of state transition rules each includes rules that potentially conflict in their access to the data elements.

7. A system for designing a synchronous digital system comprising:

means for accepting specifications of a plurality of data elements whose values define a state of the synchronous digital system and specifications of a plurality of state transition rules, wherein application of at least some of the state transition rules updates values of the data elements according to the specification of said state transition rule; and means for computing a specification of the synchronous digital system such that at least some state transitions of the synchronous digital system each corresponds to application of a group of two or more of the state transition rules, wherein at least some of the groups of state transition rules each includes rules that potentially conflict in their access to the data elements.

* * * * *